United States Patent [19]

Kuhlmann et al.

[11] Patent Number: 4,857,746
[45] Date of Patent: Aug. 15, 1989

[54] METHOD FOR PRODUCING AN OPTOCOUPLER

[75] Inventors: Werner Kuhlmann, Munich; Werner Spaeth, Holzkirchen; Guenter Waitl, Regensburg; Joerg Klann, Thannhausen, all of Fed. Rep. of Germany

[73] Assignee: Siemens Aktiengesellschaft, Berlin and Munich, Fed. Rep. of Germany

[21] Appl. No.: 101,617

[22] Filed: Sep. 28, 1987

[30] Foreign Application Priority Data

Sep. 30, 1986 [DE] Fed. Rep. of Germany ....... 3633181

[51] Int. Cl.$^4$ ............................................. H01L 31/12
[52] U.S. Cl. ..................... 250/551; 357/19; 437/3; 437/905
[58] Field of Search .............. 250/551; 357/19; 437/3, 437/5, 8, 51, 905, 906

[56] References Cited

U.S. PATENT DOCUMENTS

| | | | |
|---|---|---|---|
| 3,229,104 | 1/1966 | Rutz | 250/211 |
| 3,914,137 | 10/1975 | Huffman et al. | 357/19 |
| 4,040,078 | 8/1977 | Eckton, Jr. et al. | 357/19 |
| 4,275,404 | 6/1981 | Cassiday et al. | 357/19 |

FOREIGN PATENT DOCUMENTS

| | | |
|---|---|---|
| 0150929 | 8/1985 | European Pat. Off. |
| 3233177 | 6/1983 | Fed. Rep. of Germany |
| 2228303 | 11/1974 | France |

OTHER PUBLICATIONS

Patent Abstracts of Japan, vol. 7, No. 80, 4/2/83, No. 58-7886.
Patent Abstracts of Japan, vol. 7, No. 80, 5/24/83, No. 58-37977.
IEEE Journal, vol. SC-14, No. 6, 12/79, Mori et al.
IEEE Journal, vol. SC-16, No. 4, 8/81, Ueda et al.

*Primary Examiner*—Edward P. Westin
*Attorney, Agent, or Firm*—John F. Moran

[57] ABSTRACT

In order to manufacture respectively optocouplers or reflex light barriers particularly efficiently, semiconductor light transmitters and semiconductor light receivers are situated on a single substrate. The optic coupling or optic isolation of light transmitter and light receiver takes place in the substrate. Only then are semiconductor elements separated into discrete units.

4 Claims, 7 Drawing Sheets

METHOD FOR PRODUCING AN OPTOCOUPLER

BACKGROUND OF THE INVENTION

This invention relates to a method for producing an optocoupler including a reflective light barrier integrated within a substrate. The invention further relates to optocoupler or reflective light barrier structures in integrated form within a substrate.

The production of reflective light barriers respectively of optocouplers is intended to be as simple, efficient and advantageous as possible. Reflective light barriers respectively optocouplers for special applications are intended to be built on a particularly small scale (mini construction).

A common approach in the state of the art is to provide reflective light barriers with the aid of a tape conductor technique using either a single tape technique or a two-tape technique wherein optical transmitter and optical receiver are separated from each other and encapsulated by an opaque layer of filled synthetic. The outlet window of the transmitter and the inlet window of the receiver are respectively filled with transparent plastic in a reflective light barrier of this nature. In optocouplers in single band or in two-band technique according to the state of the art, the light transmitter and light receiver are optically coupled with a transparent resin and this optically coupled system is subsequently embedded in an opaque plastic.

SUMMARY OF THE INVENTION

The present invention is based on the objective of providing a method for the manufacture of an optocoupler respectively a reflective light barrier, an optocoupler and a reflective light barrier of the above mentioned kind, with which optocouplers respectively reflecting light barriers may be manufactured particularly conveniently.

Designs and advantages of the invention are described in the specification, and in the illustrated drawing.

The invention permits, in addition to other illustrative embodiments, the manufacture of reflective light barriers respectively optocouplers by a combination of monolithic and hybrid techniques. In this connection any and all methods and measures may be used, which come to mind in connection with monolithic and in connection with hybrid techniques.

A structural unit according to the invention may, for example, also be built as a surface mounting device (SMD) structural unit, which is suitable for surface mounting. A structural unit according to the invention may also be placed inside any suitable housing. All techniques may be used which are suitable by those skilled in the art.

In a structural unit according to the invention, a light transmitter and a light receiver are located on a common substrate. The common substrate may, for example, comprise glass, ceramic or a plastic material. The common substrate may have conductive paths and/or other devices considered suitable for an electrical connection, for example, bonding pads. Light transmitter and light receiver may be located on a single side of the substrate or they may be separated by being respectively on the front and back side of the substrate or vice versa.

In particular, the light receiver may be monolithic to the substrate. Respective light transmitter and light receiver may be placed in at least one groove of the substrate.

The optical coupling or the optical isolation of light transmitter and light receiver may occur within the substrate.

If the light receiver is developed monolithically in a light receiver semiconductor wafer, the light transmitter may be placed, electrically insulated, directly on the light receiver semiconductor wafer. The electrical insulation of the light transmitter may, in this connection take place, for example comprise a passivation layer, for example, an oxide layer or a combination of an oxide layer and a nitride layer, via a device of synthetic material or via sintered glass. In reflective light barriers, light transmitter and light receiver may be separated by at least one shutter. This shutter may comprise, for example, one silicon crystal oriented in the 100 crystallographic direction having with suitably etched structures.

A reflective light barrier according to the invention may be built as a plurality of reflective light barriers and a plurality of photo detectors.

For the light transmitter any suitable semiconductor diode may be used. For the light receiver any suitable light detector, for example, a phototransistor or a photodiode may be used.

An important feature of the invention is that optical coupling of respective light transmitters and light receivers occurs on a single substrate forming respective optocouplers which are subsequently separated into discrete structural units. This means, that on one substrate several structural units are simultaneously produced while the separation into discrete units of these structural units takes place only after the optical coupling or after the optical isolation of light receiver and light transmitter, which are associated with a structural unit according to the invention, has been completed.

It is desirable to perform functional testing of the structural units in accordance with the invention while the devices in the substrate are formed before the separation process.

A structural unit according to the principles of the invention may be further processed after separation with conventional methods known to those skilled in the art before further processing of the semiconductor chips. This means that a structural unit according to the invention, similar to a semiconductor chip, may be placed in a casing or in a housing, or may be bonded and then encapsulated.

BRIEF DESCRIPTION OF THE DRAWING

The invention is explained in greater detail in conjunction with the drawing. Various illustrative embodiments of the invention are depicted in FIGS. 1 to 19 wherein numerous objects and features in addition to advantages already mentioned will become apparent to those skilled in the art upon consideration of this information.

DETAILED DESCRIPTION

Figure 1:
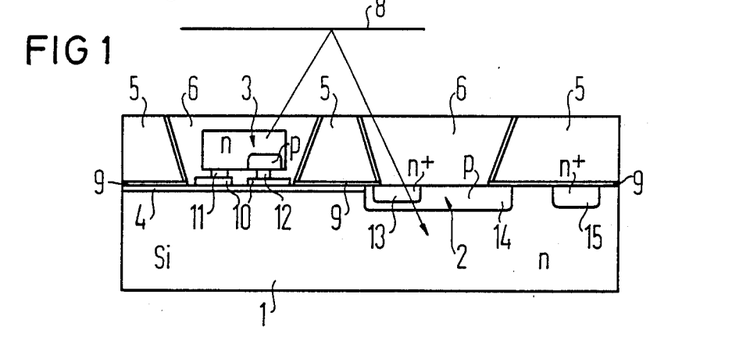
FIGS. 1 to 7 illustrate various reflective light barriers in accordance with the principles of the invention.
Figure 2:
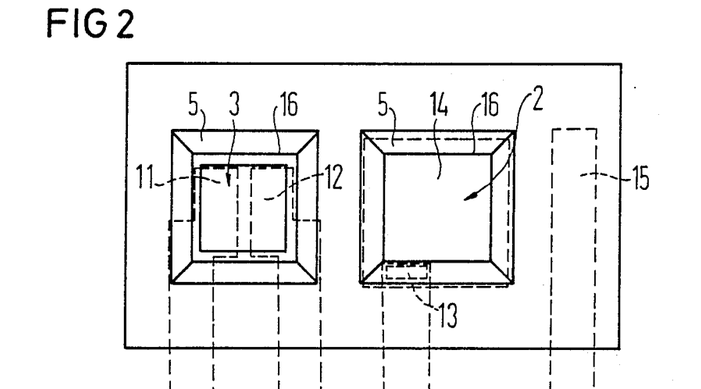
Figure 3:
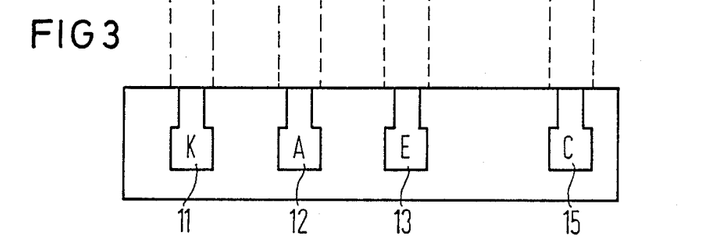

Before describing the details of the various reflective light barriers and/or optocouplers in accordance with the inventive principles, it should be pointed out that in each of the Figures, a single unit is depicted occupying a portion of a semiconductor wafer wherein a plurality of such units are arranged as an array extending over the surface area of the semiconductor wafer. Accordingly, for example, FIGS. 1-3 depict a single unit while FIGS. 5-7 include broken line outlines which are indicative of their being a sectioned portion of a wafer. It should therefore be made clear that this situation consistently applies to the various illustrative embodiments of the invention described hereinafter.

In a silicon substrate 1, a phototransistor 2 is formed as a npn-transistor. The phototransistor 2 includes the emitter 13, the base 14 and the collector 15. The silicon substrate 1 may also be designed as an integrated circuit, which, for example also contains a control for the light transmitter 3 and/or for the photodetector 2. A photodiode may also be basically used as photodetector 2.

An insulating layer 4 is partially applied on the silicon substrate 1. The insulating layer 4 may, for example, comprise an oxide layer. A light transmitter 3 is located on this insulating layer 4. The light transmitter 3 may be a planar gallium arsenideinfrared emitting diode (GaAs-IRED). This light transmitter 3 has an anode 12 with a p-type conducting zone and a cathode 11 with an n-type conducting zone. The light transmitter 3 may be placed on metallizations 10, which are located on the insulating layer 4, by soldering or by adhesion.

The light transmitter 3 in FIG. 1 is applied directly on the light receiver semiconductor wafer. The light transmitter 3 and the light receiver 2 are optically separated by shutters 5. The shutters 5 can be of silicon oriented in 100 crystallographic direction with suitable etched structures. The shutters are fastened by adhesive agents 9 on the substrate 1. The shutters have a reflector 8 at appropriate sites, which may comprise gold, aluminum or any other suitable material. The light outlet window and the light inlet window may be filled with a transparent synthetic material 6. The light emitted by the light transmitter 3 may be reflected by a mirror 8 when using the reflex light barriers and finally impinge on the light receiver 2.

FIG. 2 shows schematically a view from above of the arrangement according to FIG. 1. The inner framing of the transparent light inlet window respectively light outlet window is labeled 16 in FIG. 2.

FIG. 3 illustrates bond pads which are suitable be soldered or bonded. The metallizations present in FIGS. 1 and 2 for the cathode 11, for the anode 12, for the emitter 13, and for the collector 15 can be extended to the surface of the structural element according to FIG. 1 in an appropriate location and there developed as bond pads. These bond pads may, for example, be variously located on the upper side of the structural element, on the lower side or on one or several side faces. The bond pads may also be distributed over several faces of the surface of the structural element.

Figure 4:
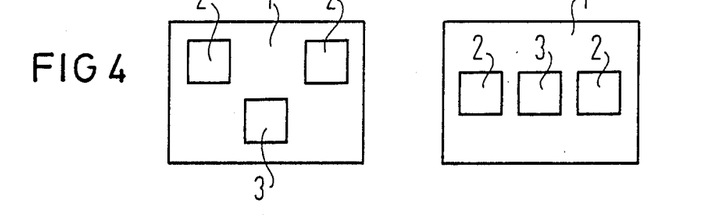

A configuration according to FIG. 1 may also be so designed that several photodetectors are available. FIG. 4 shows two possible ways of arranging, for example two photodetectors with respect to one single light transmitter. For instance, one transmitter 3 may be located in the middle between two detectors 2. Or one transmitter 3 and two detectors 2 may form the vertices of a triangle.

Figure 5:
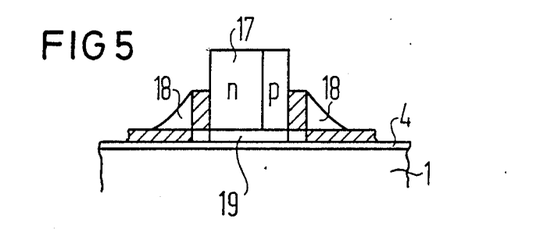

FIG. 5 demonstrates that in a configuration according to FIG. 1, instead of a planar IRED as light transmitter 3, a Mesa-IRED as light transmitter 17 can also be employed. The light transmitter 17 can be a GaAs respectively a GaAlAs structural device. The light transmitter 17 can be fastened on the insulating layer 4 with an insulating adhesive agent 19. The light transmitter 17 can be connected with solder respectively conductive adhesive agent 18.

Figure 6:
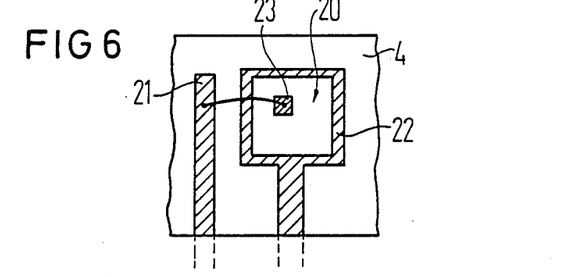
Figure 7:
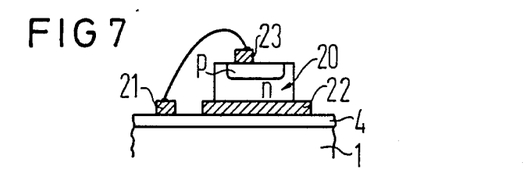

FIGS. 6 and 7 show a reflex light barrier, in which a light transmitter 20 is wire-bonded to a conductive path 21. For light transmitter 20, a planar or a Mesa-IRED can be used for this purpose. On the insulating layer known from FIG. 1, a metallization 22 for the cathode of the light transmitter 20 is placed. On this metallization 22, the light transmitter 20 is fastened. The anode 23 of the light transmitter 20 is wire-bonded to the conducting path 21, which, in turn, is likewise placed on the insulating layer 4. The metallizations 21 and 22 can be run to suitable device contacts.

FIGS. 8 to 19 show optocouplers in accordance with the principles of the invention.

Figure 8:
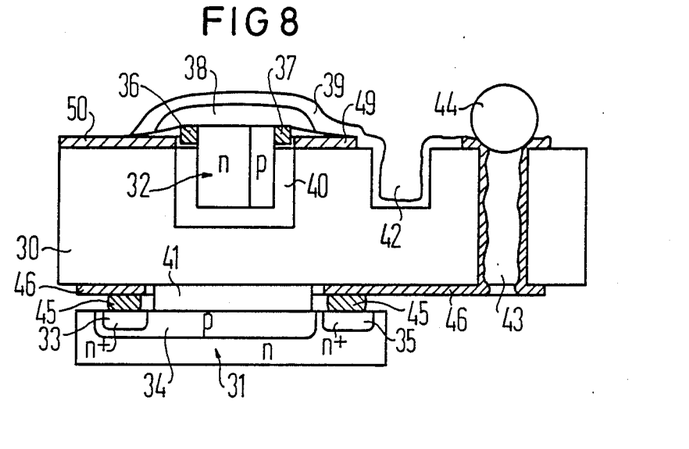
FIGS. 8 and 9 are respective side and top views of an illustrative embodiment of an optocoupler in accordance with the invention.

FIG. 8 shows schematically a cross section through an optocoupler. A substrate 30 optically couples the light transmitter 32 to the light receiver 31. For light transmitter 32, an IRED can be used which is located in a groove of the substrate 30. The substrate 30 may comprise glass, a transparent ceramic or a synthetic material. Cathode 36 and anode 37 of the light transmitter 32 are electrically connected with solder or a conductive adhesive to bonding pads 50, 49 as is made evident in FIG. 9, which represents a top view of the arrangement illustrated in FIG. 8.

The light transmitted by the light transmitter 32 is reflected on the side facing away from the light receiver 31 by a reflecting device 38. This reflecting device 38 can be a synthetic material, for example a synthetic resin filled with titanium dioxide. The structural element according to FIG. 1 can, in addition, finally be covered with a protective varnish 39.

Figure 9:
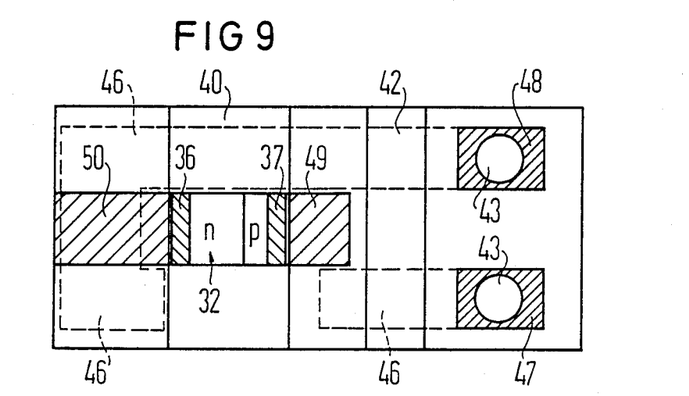

The light transmitted by the light transmitter 32 reaches the light receiver 31 by way of the substrate 30 and the transparent synthetic material layer 41 located between the substrate 30 and the light receiver 31. The light receiver 31 includes an emitter 33, the base 34, and the collector 35. Transmitter 33 and collector 35 are electrically connected with the metallizations 46 by solder 45. These metallizations 46 can be connected by way of the through-connection 43, also called a via, through the substrate 30 to the upper side of the substrate 30, on which the bond pads 49, 50 for the light transmitter already are. FIG. 9 illustrates using such through-connections 43 on the upper side of the substrate 30 the bond pad 47 for the collector 35 and the bond pad 48 for the transmitter 33.

The optocoupler according to FIGS. 8 and 9 has a depression 42 in the substrate 30 between the bond pads 49, 50 for the light transmitter 32 and the bond pad 47, 48 for the light receiver 31, which serves to increase the dielectric strength between light transmitter and light detector.

The bonding pads 47 to 50 are soldered or bonded.

The contacts 47 to 50 may also, like other contacts in other structural units according to the invention, be provided with so-called bumps 44. Such bumps 44 are known, for example from "face-down" or "flip-flop" mounting. This method simultaneously serves to connect and to secure non-encapsulated semiconductors in hybrid circuits. In order to do this, the structural units must be designed as a "flip-chip". The connection on the system side are formed like wart-shaped bumps. These are connected by soldering or welding with the contact surfaces provided on the substrate. The system side of the semiconductor in this arrangement is facing the substrate.

Figure 10:
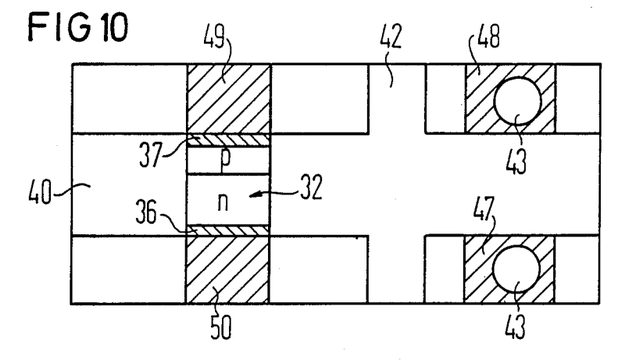
FIG. 10 provides a slightly modified and rotated version of the arrangement of FIGS. 8 and 9.

The light transmitter 32 can, compared to the configuration in FIGS. 8 and 9, in the view from above be rotated by 90°, as is shown in FIG. 10. This rotation in a simple manner permits a variation in the arrangement of the bonding pads 49, 50.

Figure 11:
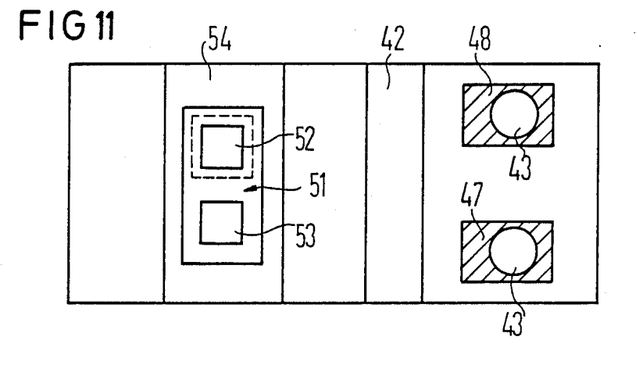
FIG. 11 is another modification of the arrangement of FIG. 8.

FIG. 11 illustrates a configuration according to FIG. 8 in a view from above wherein as the light transmitter, however, a planar IRLED 51 is used. The planar light transmitter 51 is largely surrounded by transparent synthetic resin 54. The planar light transmitter 51 has an anode 52 and a cathode 53. An arrangement as depicted in FIG. 11 has the advantage that the metal contacts of the planar light transmitter 51 may be used directly as the bonding pads.

Figure 12:
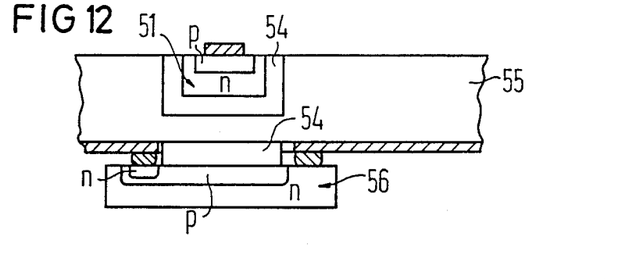
FIG. 12 is a cross-sectional view of the structure of FIG. 11.

FIG. 12 illustrates a cross sectional view through an optocoupler of the type depicted in FIG. 11. The optical coupling between the light transmitter 51 and the light detector 56 occurs through transparent synthetic resin 54 and over the transparent substrate 55. Between the detector 56 and the substrate 55 is also a transparent resin 54.

Figure 13:
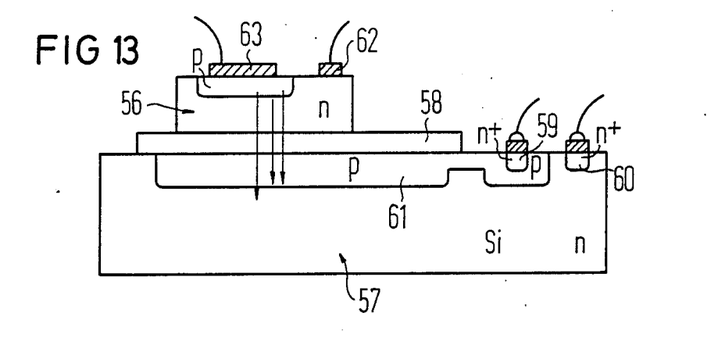
FIG. 13 depicts an arrangement for mounting a light transmitter.

FIG. 13 shows an optocoupler, in which the transmitter 56 is—insulated by the transparent insulator 58—placed directly on the light receiver semiconductor wafer. In the semiconductor wafer several light receivers 57 with one emitter 59, one collector 60 and one base 61 are formed. To manufacture the light receiver 57, various techniques known to those skilled in the art such as diffusion, contact diffusion, metallization, etc. may be used to advantage. Even before—after completion of the requisite steps for the production of the light receivers—the semiconductor wafer is cut into the individual light receivers 57, on each of the discrete light receivers 57 located in an array pattern on a wafer wherein one transparent insulator 58 is applied and on this insulator 58 the light transmitter 56 is attached. In this method not only the manufacture of a structural unit according to the principle of the invention is simplified, but also the testing of such structural units is significantly simplified if dimensioning of these structural likewise is carried out before the separation into discrete units of the optocouplers.

The light transmitters 56 are glued onto a prepared silicon light receiver semiconductor wafer. Only after completion of this step is the wafer separated into discrete parts.

The light transmitter 56 of FIG. 13 may be an infrared-light emitting diode (IR-LED) having a cathode 62 and an anode 63.

Figure 14:
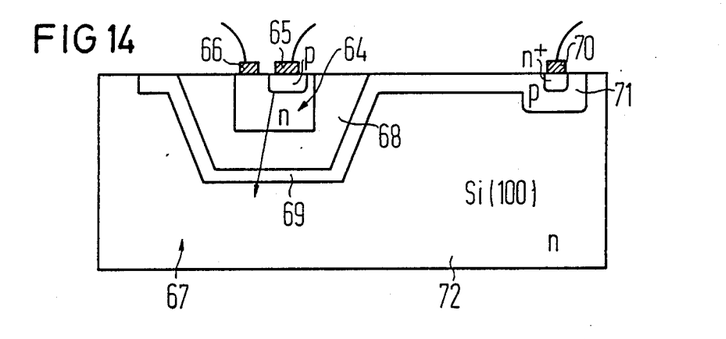
FIGS. 14 and 15 depict further illustrative embodiments of optocouplers.
Figure 15:
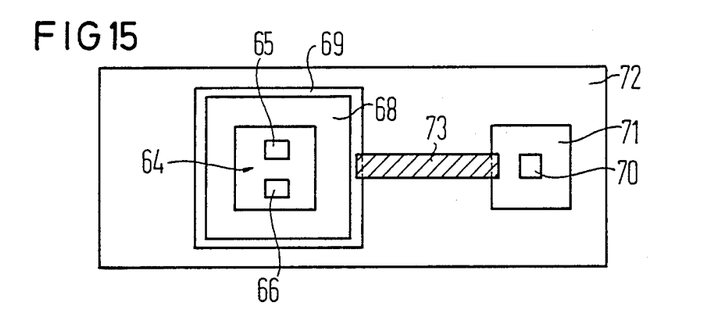

FIGS. 14 and 15 depict another illustrative embodiment of an optocoupler. In a silicon (100) substrate, a light receiver 67 having a particular structure is formed. In the region of the light transmitter 64, the silicon substrate has a depression, in which a photodiode is developed. This photodiode 69 includes in the region of the depression of a collector 72 and a further zone, which has the same conductivity as the base 71 of the light receiver 67 and is electrically connected with the base 71 via a semiconductor zone of the same conductivity type as base 71, or by way of a metal strip 73. The light receiver 67 also has transmitter 70, base 71 and the collector 72.

The light transmitter 64, which has an anode 65 and a cathode 66, is located in the depression of the substrate. Between light transmitter 64 and the photodiode 69, a transparent synthetic material 68 is placed.

FIG. 15 depicts a top view of the slightly modified arrangement of FIG. 14.

As in all structural components according to the invention, mounting and testing of the optocouplers in the case of the optocoupler of FIGS. 14 and 15 occurs on the wafer, which is subsequently separated.

The size of the processed chip of a component in accordance with the invention is selected to provide the required dielectric strength. A structural unit in accordance with the invention offers many possibilities of varying the dielectric strength by relatively simple measures. The optical coupling over a substrate or over an insulator on a substrate permits variation of the dielectric strength by varying the lengths or by varying the depressions in the substrate of by varying the selection of materials.

Figure 16:
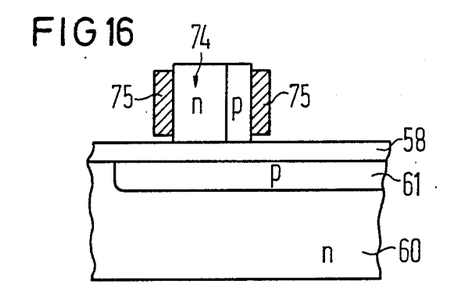
FIG. 16 employs a mesa infra-red emitting diode of the arrangement of FIG. 13.

Optocouplers, such as shown in FIGS. 13 and 14, can also be equipped with a mesa-IRED instead of with planar light transmitters 56 respectively 64. FIG. 16 in this manner corresponds to FIG. 13. Instead of the light transmitter 56 in FIG. 13, the mesa-IRED 74 with the contacts 75 can be used.

Figure 17:
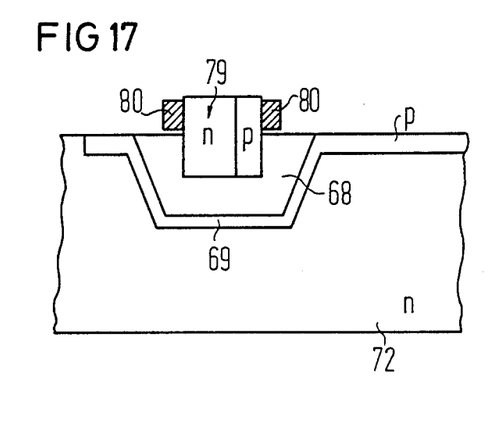
FIG. 17 is an alternative light transmitter arrangement.

FIG. 17 corresponds to an arrangement similar to FIG. 14. Instead of the light transmitter 64 in FIG. 14, a mesa-IRLED having contacts 80 may be used as shown in FIG. 17.

Figure 18:
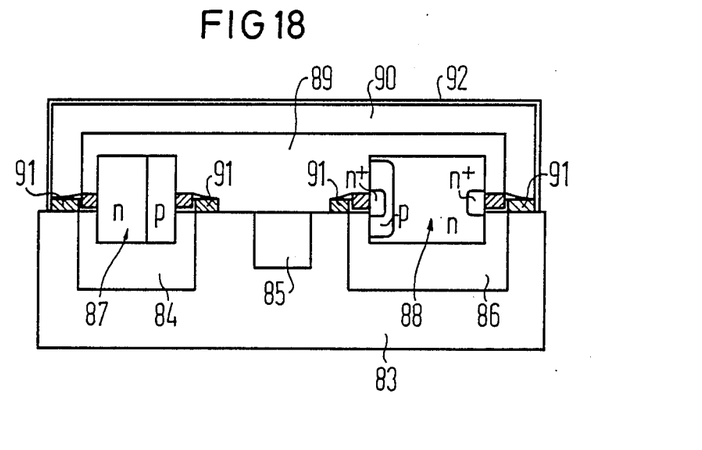
FIGS. 18 and 19 are a further illustrative embodiment of the invention.
Figure 19:
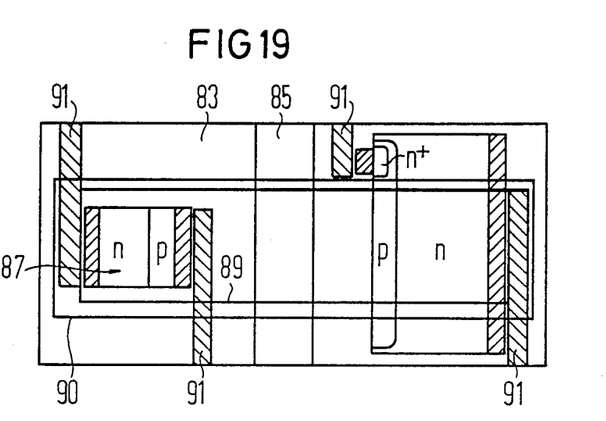

FIGS. 18 and 19 depicts a further illustrative embodiment of an optocoupler, in which the optical coupling between light transmitter 87 and light receiver 88 is carried out advantageously in processing an array of such units in wafer form. The substrate 83 has a depression 84 for receiving the light transmitter 87, a depression 86 for receiving the light receiver 88 and a depression 85 for the purpose of increasing the high-tension resistance. Between light transmitter 87 and substrate 83 in the depression 84 a reflecting synthetic material is located. Between light receiver 88 and substrate 83 in the depression 86, a reflecting synthetic material is also located. The optical coupling between light transmitter 87 and light receiver 88 takes place over a light conductor 89, which is located on the upper side of the substrate 83. The light conductor 89 can be pressed against the upper side of the substrate 83 with a glass cover 90. The light conductor 89 can be of synthetic material, which is placed into a depression of the glass cover 90, for example in a groove of the glass cover 90. The glass cover 90 may be provided on its upper side with a reflecting layer 92, for example, a coating containing titanium dioxide. The glass cover 90 may be applied as single piece glass plate on the wafer before separation into die. This glass plate has on its underside, on which the light conductor 89 is located, additional grooves, which on the insides are likewise provided with a reflecting layer and which are so arranged on the substrate 83, that the present hollow spaces allow that the glass plate 90 through scratching or sawing or other means is structured in such a way that in a view from above according to FIG. 19 the completed optocoupler on its upper side (view from above) is only partially covered by the glass cover 90 remaining permanently on the optocoupler. This permits bringing out the metallized conductors 91 for connecting light transmitter 87 and light receiver 88.

An optocoupler as shown in FIGS. 18 and 19 has the significant advantage that in a simple and convenient manner in a substrate, which can consist of ceramic, different depressions are etched, that subsequently the semiconductor chips of the transmitter 87 and the receiver 88 can be placed into the depressions, that subsequently the substrate 83 in its entirety is placed in a solder bath where the semiconductor chips of the transmitters 87 and 88 are soldered. In an optocoupler as shown in FIGS. 18 and 19, the entire number of units corresponding to a wafer may be soldered using immersion soldering. Bonding then becomes superfluous. To this end, very small semiconductor chips can be used for the transmitter 87 and for the receiver 88. For example, 100 micron chips can be utilized. Fastening in transmitter 87 is, for instance, similar to fastening a transmitter 32 in FIG. 8.

As reflecting synthetic material in the trenches 84 and 86 in substrate 83 in FIG. 18, a titanium dioxide, for example, filled adhesive agent can be used.

For light receiver 88, a phototransistor or a photodiode may be employed.

For substrate 83, a thin layer or a thick layer of ceramic may be used. This ceramic is provided with grooves or any suitably shaped depressions 84, 85, 86. These grooves are filled with a reflecting adhesive agent. In this adhesive agent, the transmitters 87 respectively receivers 88 are fastened. The transmitters 87 and receivers 88 are then optically coupled with a transparent substance. This transparent substance 89 can advantageously be placed into a cavity and fill it. This cavity is advantageously located in a plate or in another opposing piece to the ceramic 83. For optical conductor 89, synthetic materials are suitable. A glass cover 90 has the advantage of a small thermal coefficient of expansion.

After separation of a ceramic wafer, the discrete optocouplers as shown in FIG. 18 may be placed into a lead frame and electrically connected by wire bonding. Such optocoupler is suitable for any injection modling substance for encapsulating the structural element. If electrical contacts are placed, for example, on the back side of the structural element, a SMD-structural element is obtained, which is suitable for surface mounting.

There has thus been shown and described novel optocouplers and reflective light barriers which fulfill all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

We claim:

1. A method for manufacturing optocouplers comprising the steps of: forming arrays of semiconductor light transmitters and semiconductor light receivers arranged on opposite sides of a single substrate wafer, forming reflective light barriers respectively covering the light transmitters on the side of the wafer opposite the light receivers, optically coupling through the wafer and by reflection off the respective light barriers each one of the transmitters to at least one of the light receivers thus forming respective optocouplers on the wafer, and subsequently separating the respective optocouplers into discrete units.

2. A method according to claim 1, wherein testing of the optocouplers occurs in the array and before separation.

3. A method according to claim 1, further comprising the step of placing each one of the optocouplers on a lead frame.

4. A method according to claim 1, further comprising encapsulating each one of the optocouplers.

* * * * *